United States Patent
Lee et al.

(10) Patent No.: US 9,627,619 B2
(45) Date of Patent: Apr. 18, 2017

(54) THIN FILM FORMING APPARATUS AND THIN FILM FORMING METHOD USING THE SAME

(71) Applicant: Samsung Display Co., Ltd., Yongin, Gyeonggi-Do (KR)

(72) Inventors: Duckjung Lee, Yongin (KR); Jiyoung Choung, Yongin (KR); Kyuhwan Hwang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 31 days.

(21) Appl. No.: 14/605,965

(22) Filed: Jan. 26, 2015

(65) Prior Publication Data

US 2016/0064670 A1   Mar. 3, 2016

(30) Foreign Application Priority Data

Sep. 3, 2014 (KR) .......................... 10-2014-0117027

(51) Int. Cl.
*H01L 21/00* (2006.01)
*H01L 51/00* (2006.01)
(Continued)

(52) U.S. Cl.
CPC ........ *H01L 51/0013* (2013.01); *C23C 14/042* (2013.01); *C23C 14/28* (2013.01); *H01L 51/001* (2013.01); *H01L 51/0009* (2013.01); *H01L 51/0011* (2013.01); *H01L 51/0037* (2013.01); *H01L 51/0052* (2013.01); *H01L 51/5012* (2013.01)

(58) Field of Classification Search
CPC . H01L 51/0013; H01L 51/56; H01L 51/0011; H01L 51/001; H01L 51/009; H01L 51/5012; H01L 51/0037; H01L 51/0052; C23C 14/042; C23C 14/28
USPC .......... 438/22, 38, 48, 57, 118, 28; 118/721, 118/722, 504; 257/E21.001, E21.174
See application file for complete search history.

(56) References Cited

U.S. PATENT DOCUMENTS 5,521,035 A * 5/1996 Wolk ................. B41M 5/38207
                                                      430/20
5,851,709 A * 12/1998 Grande .............. B41M 5/38214
                                                      257/E31.121
(Continued)

FOREIGN PATENT DOCUMENTS

JP   2009-120946 A   6/2009
JP   2009-199856 A   9/2009
(Continued)

OTHER PUBLICATIONS

Ling, M. et al., Thin Film Deposition, Patterning, and Printing in Organic Thin Film Transistors, 2004, pp. 4824-4840, vol. 16, American Chemical Society.

(Continued)

*Primary Examiner* — Thinh T Nguyen
(74) *Attorney, Agent, or Firm* — Lewis Roca Rothgerber Christie LLP

(57) ABSTRACT

A thin film forming apparatus includes: a thin film source including a thin film on one surface of the thin film source to be transferred to a substrate; and a light emitter configured to apply light energy to the thin film source to transfer the thin film to the substrate.

8 Claims, 5 Drawing Sheets

(51) Int. Cl.
*C23C 14/04* (2006.01)
*C23C 14/28* (2006.01)
*H01L 51/50* (2006.01)

(56) References Cited

U.S. PATENT DOCUMENTS

| | | | |
|---|---|---|---|
| 6,610,455 B1* | 8/2003 | Burberry | H01L 51/0013 430/200 |
| 7,993,945 B2 | 8/2011 | Ikeda et al. | |
| 8,071,404 B2 | 12/2011 | Yamazaki et al. | |
| 8,093,612 B2 | 1/2012 | Tanaka | |
| 8,129,004 B2 | 3/2012 | Matsuo | |
| 8,153,201 B2* | 4/2012 | Aoyama | H01L 51/0013 427/407.1 |
| 2004/0108047 A1* | 6/2004 | Afzali-Ardakani | B41M 5/265 156/230 |
| 2005/0095866 A1 | 5/2005 | Toyoda | |
| 2006/0050102 A1* | 3/2006 | Kojima | B41J 29/393 347/19 |
| 2007/0014916 A1* | 1/2007 | Daniels | B82Y 20/00 427/66 |
| 2009/0104721 A1 | 4/2009 | Hirakata et al. | |
| 2009/0104835 A1* | 4/2009 | Aoyama | H01L 51/0013 445/58 |
| 2009/0279179 A1* | 11/2009 | Tanaka | C23C 14/12 359/619 |
| 2015/0132875 A1 | 5/2015 | Lee et al. | |

FOREIGN PATENT DOCUMENTS

| | | |
|---|---|---|
| JP | 2010-093068 A | 4/2010 |
| KR | 10-2005-0024224 A | 3/2005 |
| KR | 10-2010-0134356 A | 12/2010 |
| KR | 10-2013-0139821 A | 12/2013 |
| KR | 10-2015-0056112 | 5/2015 |
| WO | WO 2011/032938 A1 | 3/2011 |
| WO | WO 2013/041336 A1 | 3/2013 |

OTHER PUBLICATIONS

Jin, H., Novel Patterning Methods for Full-Color Polymer Light-Emitting Displays, A Dissertation Presented to the Faculty of Princeton University in Candidacy for the Degree of Doctor of Philosophy, Jan. 2010, 99 pages.

* cited by examiner

THIN FILM FORMING APPARATUS AND THIN FILM FORMING METHOD USING THE SAME

CROSS-REFERENCE TO RELATED APPLICATION

This application claims priority to and the benefit of Korean Patent Application No. 10-2014-0117027, filed on Sep. 3, 2014, in the Korean Intellectual Property Office, the disclosure of which is incorporated herein in its entirety by reference.

BACKGROUND

1. Field

One or more embodiments of the present invention relate to an apparatus for forming a thin film on a substrate and a method of forming a thin film using the apparatus.

2. Description of the Related Art

When an organic light-emitting display apparatus is manufactured, a process of forming a thin film such as an organic light-emitting layer on a substrate is utilized.

SUMMARY

One or more embodiments of the present invention are directed toward an apparatus for forming a thin film on a substrate, and a method of forming a thin film using the apparatus.

Additional aspects will be set forth in part in the description which follows, and, in part, will be apparent from the description, or may be learned by practice of the presented embodiments.

According to one or more embodiments of the present invention, a thin film forming apparatus includes: a thin film source including a thin film on one surface of the thin film source to be transferred to a substrate; and a light emitter configured to apply light energy to the thin film source to transfer the thin film to the substrate.

A mask configured to pattern the thin film may be interposed between the substrate and the thin film source.

A window configured to press the thin film source toward the substrate may be interposed between the thin film source and the light emitter.

The thin film source may be configured to transfer the thin film to the substrate a plurality of times while being moved.

The thin film source may include a roll configured to be wound and released.

The thin film source may include a plate configured to be horizontally movable.

The thin film source may be configured to move in forward, backward, left, and right directions along a plane facing the substrate.

The thin film may include material to form an organic light-emitting layer of an organic light-emitting display apparatus.

According to one or more embodiments of the present invention, a method of forming a thin film includes: arranging a thin film source to face a substrate, the thin film source including a thin film on one surface of the thin film source; and transferring the thin film to the substrate by applying light energy to the thin film source.

The method may further include interposing a mask between the substrate and the thin film source for patterning the thin film.

The method may further include pressing the thin film source toward the substrate by a transparent window.

The method may further include transferring the thin film to the substrate a plurality of times while moving the thin film source.

The thin film source may include a roll, and the moving of the thin film source may include releasing the roll at one end and winding the roll at another end.

The thin film source may be movable in forward, backward, left, and right directions along a plane facing the substrate.

The thin film may include material to from an organic light-emitting layer of an organic light-emitting display apparatus.

The transferring of the thin film to the substrate may include forming the organic light-emitting layer of the organic light-emitting display apparatus.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
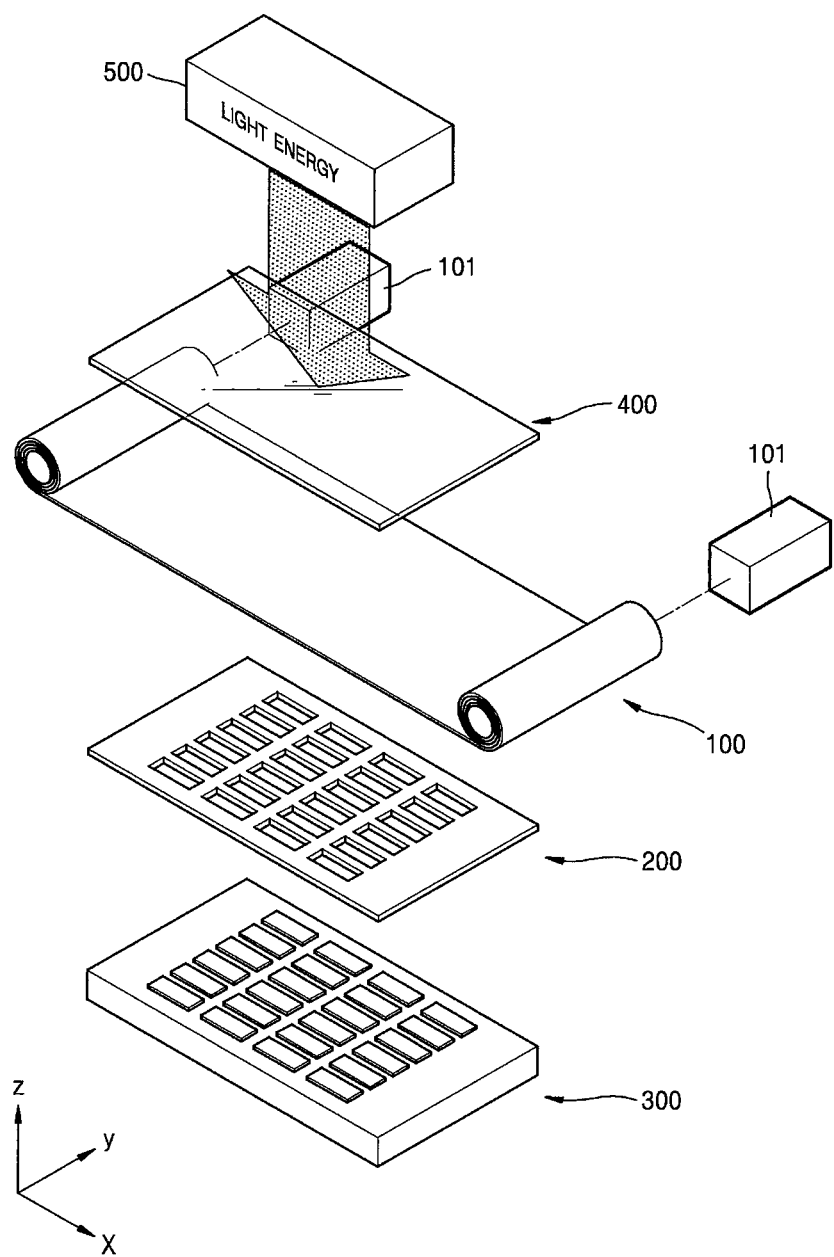
FIG. 1 is an exploded perspective view illustrating a structure of a thin film apparatus according to an embodiment of the present invention.

Reference will now be made in detail to example embodiments, examples of which are illustrated in the accompanying drawings, wherein like reference numerals refer to like elements throughout, and a redundant description thereof will be omitted. In this regard, the present example embodiments may have various different forms and should not be construed as being limited to the descriptions set forth herein. Accordingly, the example embodiments are merely described below, by referring to the figures, to describe aspects of the present description.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

As used herein, the singular forms "a," "an," and "the" are intended to include the plural forms as well, unless the context clearly indicates otherwise.

Also, terms such as "comprise," "comprising," "include," and "including" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention."

Also, the thickness or size of each layer illustrated in the drawings may be exaggerated for convenience of illustration, explanation, and clarity. For example, since the size and thickness of each element in the drawings are freely illustrated for convenience of illustration, the present invention is not limited thereto.

When an embodiment may be embodied in a different way, a particular process sequence may be performed different from the described sequence. For example, two consecutively described processes may be performed at the same time or may be performed in a sequence opposite to the described sequence.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
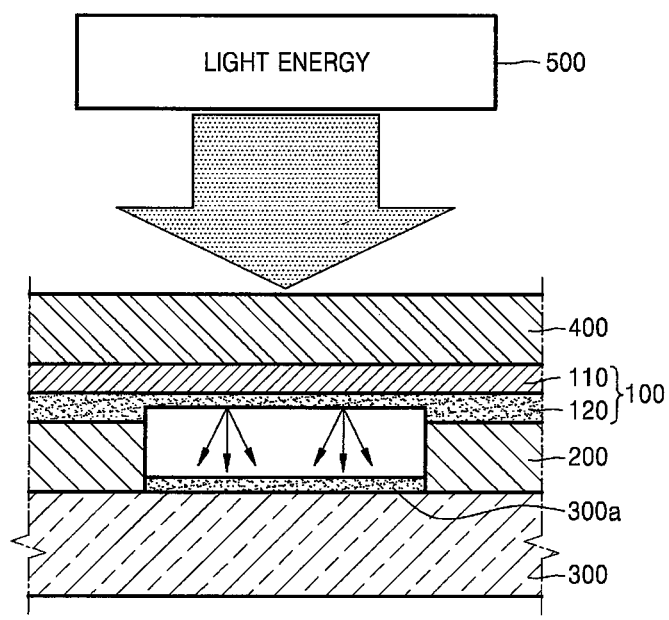
FIG. 2 is a perspective view illustrating a close contact state of the thin film forming apparatus shown in FIG. 1.

FIGS. 1 and 2 schematically illustrate a structure of a thin film forming apparatus according to an embodiment of the present invention. FIG. 1 illustrates a separated state of the components (or parts), and FIG. 2 illustrates a close contact state of the components (or parts). When a thin film is actually formed, the components (or parts) are in the close contact state as shown in FIG. 2.

As illustrated in the drawings, a thin film forming apparatus according to the present embodiment may include a mask 200 for forming a desired pattern on a substrate 300 that is a target subject to deposition, a thin film material member 100 (e.g., a thin film source) having a main body film 110 on one surface of which a thin film 120 is formed, a transparent window 400 that presses the thin film material member 100 toward the mask 200 and the substrate 300, and a light emitting unit 500 (e.g., a light emitter) for applying light energy to the thin film material member 100 to transfer the thin film 120 formed on the one surface thereof to the substrate 300.

Accordingly, when the light emitting unit 500 emits light toward the thin film material member 100, thereby supplying light energy to the thin film material member 100, as illustrated in FIG. 2, the thin film 120 on one surface of the main body film 110 passes through openings of the mask 200 to be deposited on the substrate 300, thereby forming a thin film 300a of a desired pattern. In other words, the thin film 120 of the thin film material member 100 is vaporized by the light energy to be deposited on the substrate 300. Accordingly, as illustrated in FIG. 2, since the deposition is performed within a space (e.g., a small space) that is sealed by the mask 200, a work environment may not be maintained in a high vacuum state, as in a general crucible deposition method. For example, if the inside of a chamber where deposition is performed is maintained in a relatively high vacuum state (e.g., of about $10^{-5}$ torr or lower) for the crucible deposition method, a relatively low vacuum state (e.g., of about $10^{-3}$ torr) may be available in an apparatus according to the present embodiment. Accordingly, process management is simplified. The window 400 presses the thin film material member 100 toward the mask 200 and the substrate 100 so as to closely contact each other without a gap therebetween, and concurrently (e.g., simultaneously) flattens a work portion so that light from the light emitting unit 500 may be perpendicularly incident to the work portion.

The thin film material member 100 may be movable in forward, backward, left, and right directions along a plane, for example, an X-Y plane of FIG. 1, facing the substrate 300.

The thin film material member 100 may be moved in an X direction to perform roll winding and releasing motions. For example, in the present embodiment, since the thin film material member 100 has a roll member shape as illustrated in FIG. 1, the thin film material member 100 may be moved in the X direction through a winding motion at one end, and a releasing motion at the other end. Accordingly, after a deposition patterning operation is performed with respect to the substrate 300, the thin film material member 100 is moved through the roll winding and releasing motions so that the deposition patterning operation may be performed again for an unused area. In other words, a plurality of deposition operations may be performed without replacing the thin film material member 100 with another one, while slightly moving the thin film material member 100. Also, the thin film material member 100 may be moved in a Y direction. Accordingly, since the thin film material member 100 is moved in forward, backward, left, and right directions, the unused area may be used, and thus, waste of a material may be avoided or reduced. A driving unit 101 (e.g., a driver) moves the thin film material member 100 in the X and Y directions, and a general drive mechanism, such as a motor or a cylinder, may be employed therefor.

The thin film forming apparatus configured as described above may be used, for example as follows.

As illustrated in FIG. 2, within a chamber, the substrate 300, the mask 200, the thin film material member 100, and the window 400 are provided to be closely in contact with one another. The atmosphere in the chamber may be maintained in a low vacuum state (e.g., of about $10^{-3}$ torr).

In such a state, when the light emitting unit 500 emits light toward the thin film material member 100, the thin film 120 of the thin film material member 100 is vaporized through the opening of the mask 200 to be deposited on the substrate 300, thereby forming the thin film 300a of a desired pattern. For example, a halogen lamp, a tungsten lamp, or laser may be used as the light emitting unit 500.

The thin film forming apparatus may be used, for example, to form an organic light-emitting layer of an organic light-emitting display apparatus.

Figure 3:
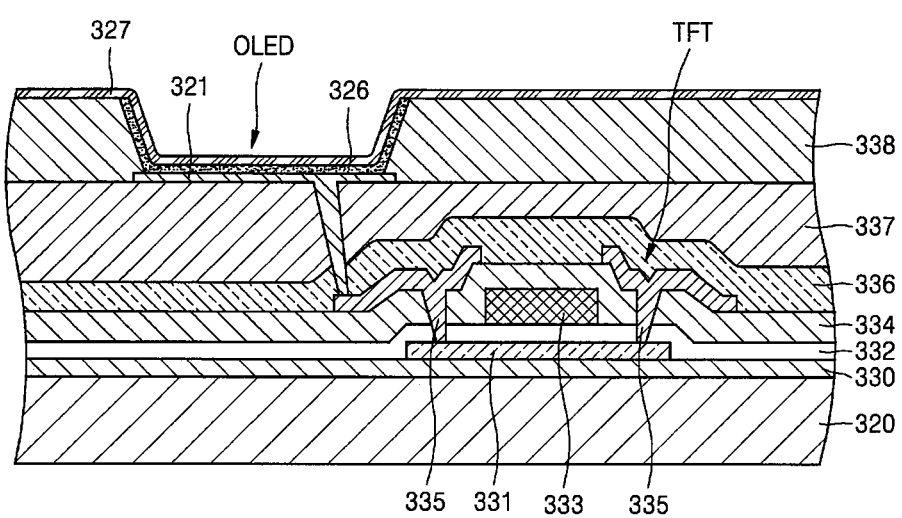
FIG. 3 is a cross-sectional view illustrating an organic light-emitting display apparatus as an example of a target on which deposition is performed by using the thin film forming apparatus shown in FIG. 1.

FIG. 3 is a cross-sectional view illustrating a structure of an organic light-emitting display apparatus as an example of an object that may be manufactured by using the thin film forming apparatus shown in FIG. 1.

Referring to FIG. 3, a buffer layer 330 is formed on a substrate 320, and a thin film transistor (TFT) is formed on the buffer layer 330.

The TFT includes a semiconductor active layer 331, a gate insulating film 332 formed to cover the active layer 331, and a gate electrode 333 on the gate insulating film 332.

An interlayer insulating film 334 is formed to cover the gate electrode 333. A source and a drain electrode 335 is formed on the interlayer insulating layer 334.

The source and the drain electrode 335 contacts a source region and a drain region, respectively, of the active layer 331 via contact holes formed in the gate insulating film 332 and the interlayer insulating layer 334.

A pixel electrode 321 of an organic light-emitting device (OLED) is coupled (e.g., connected) to the source and the drain electrode 335. The pixel electrode 321 is formed on a planarization layer 337. A pixel defining layer 338 is formed to cover the pixel electrode 321. After an opening portion (e.g., a predetermined opening portion) is formed in the pixel defining layer 338, an organic light-emitting layer 326 of the OLED is formed, and an opposite electrode 327 is deposited on the organic light-emitting layer 326.

For example, when the opening of the mask 200 corresponds to the organic light-emitting layer 326 of the OLED, and the thin film forming apparatus of the present embodiment is used, the amount of work involved in a material replacement operation in a low vacuum state is reduced, and the organic light-emitting layer 326 may be easily formed.

Figure 4:
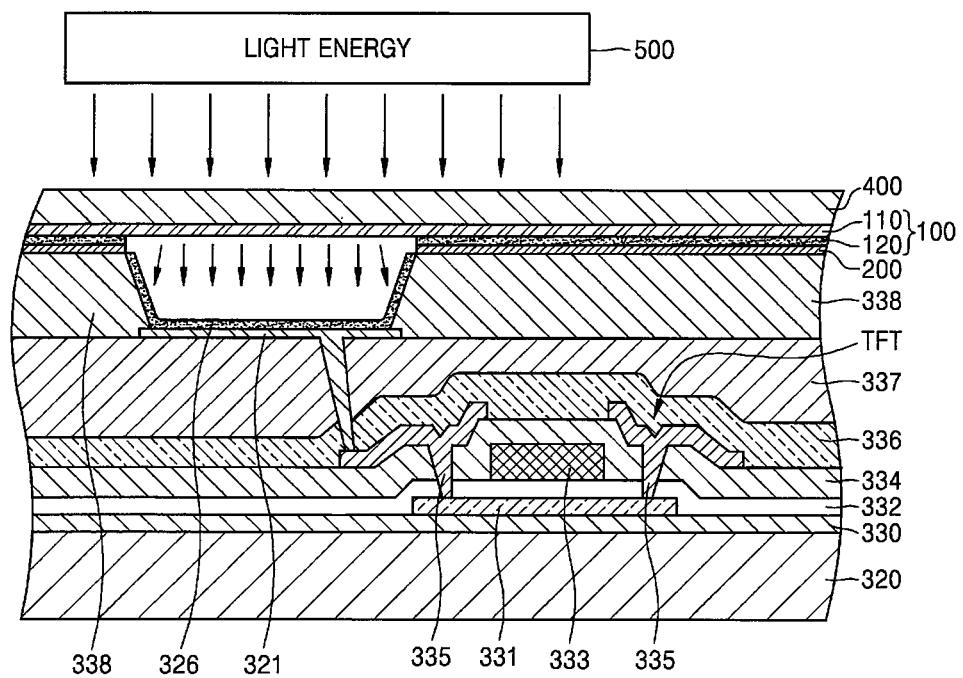
FIG. 4 is a cross-sectional view illustrating a process of forming the organic light-emitting layer of the organic light-emitting display apparatus shown in FIG. 3 by using the thin film forming apparatus shown in FIG. 1.

For example, as illustrated in FIG. 4, the opening of the mask 200 is formed to correspond to the organic light-emitting layer 326, and when the thin film 120 of the thin film material member 100 is formed by using a same or substantially the same material as that of the organic light-emitting layer 326, the thin film 120 is deposited on the substrate 320 in the same process, thereby forming the organic light-emitting layer 326. Thus, when the deposition is continuously performed with respect to a subsequent substrate 320, the thin film material member 100 is moved in the X or Y direction, so that the unused area faces the subsequent substrate 320, and new deposition may be performed thereon. For example, since R, G, and B pixels are repeatedly arranged in the organic light-emitting display apparatus, for example, when the organic light-emitting layer 326 of an R pixel is to be formed, an unused area that corresponds to positions of the G and B pixels may be used for the subsequent deposition by moving (e.g., slightly moving) the thin film material member 100 after the previous deposition.

Thus, when the thin film forming apparatus is used, since patterning is performed within a space (e.g., a small space) between the substrate and the thin film material member, the thin film forming operation may be performed without difficulty in a low vacuum state. Also, since a plurality of patterning operations may be continuously performed while moving the material deposition member, work efficiency may be improved, and usability of a material may be improved.

Figure 5:
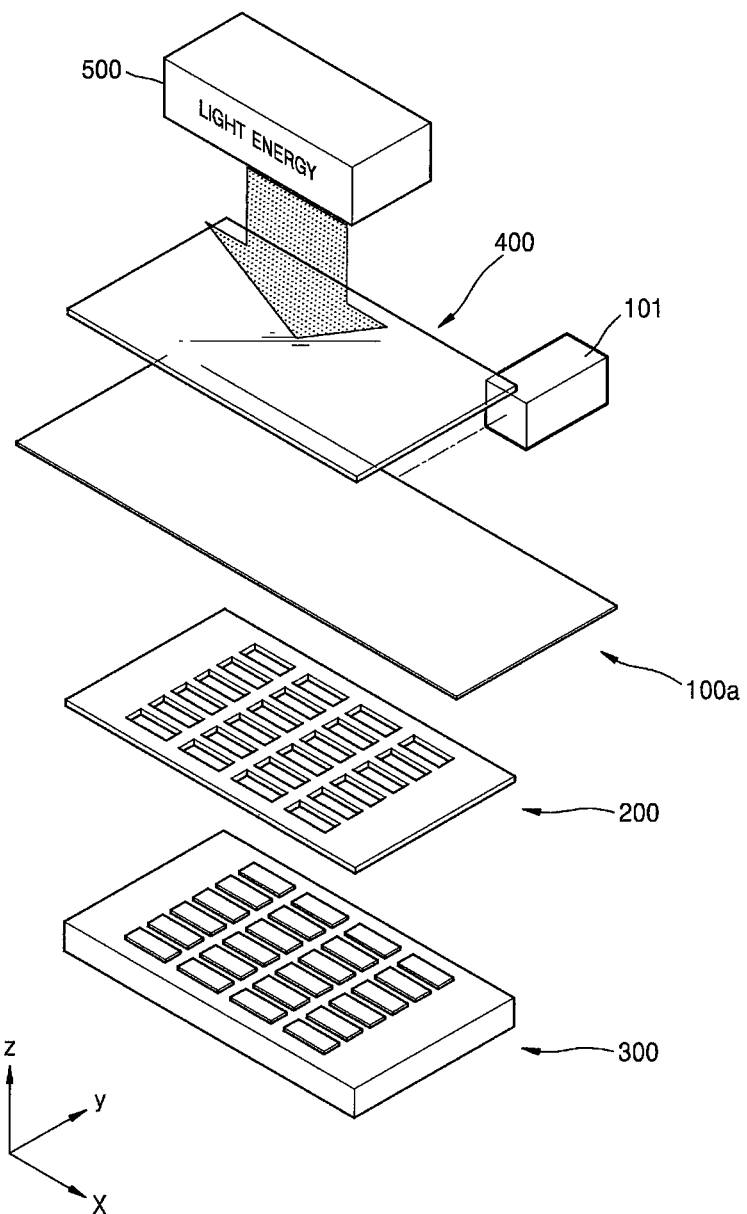
FIG. 5 is an exploded perspective view illustrating a structure of a thin film forming apparatus according to another embodiment of the present invention.

Although the above-described embodiment shows a case in which the thin film material member 100 is a roll member type capable of being wound and released, the present invention is not limited thereto. For example, as illustrated in FIG. 5, the thin film material member 100 (e.g., thin film source) may be formed in a plate member 100a, and may be configured to move in the X and Y directions. In other words, the thin film material member 100 may be variously modified, as long as it can move along a plane facing the substrate (e.g., in the X and Y directions).

It should be understood that the example embodiments described herein should be considered in a descriptive sense only, and not for purposes of limitation. Descriptions of features and aspects within each example embodiment should typically be considered as available for other similar features or aspects in other example embodiments.

While one or more embodiments of the present invention have been described with reference to the figures, it will be understood by those of ordinary skill in the art that various changes in form and details may be made therein, without departing from the spirit and scope of the present invention as defined by the following claims, and their equivalents.

What is claimed is:

1. A method of forming a thin film, the method comprising:
    arranging a thin film source to face a substrate, the thin film source comprising a thin film on one surface of the thin film source;
    arranging a mask between the thin film source and the substrate; and
    transferring the thin film through an opening of the mask to the substrate by applying light energy to the thin film source.

2. A method of forming a thin film, the method comprising:
    arranging a thin film source to face a substrate, the thin film source comprising a thin film on one surface of the thin film source;
    interposing a mask between the substrate and the thin film source for patterning the thin film; and
    transferring the thin film to the substrate by applying light energy to the thin film source.

3. The method of claim 1, further comprising pressing the thin film source toward the substrate by a transparent window.

4. The method of claim 1, further comprising transferring the thin film to the substrate a plurality of times while moving the thin film source.

5. The method of claim 4, wherein the thin film source comprises a roll, and the moving of the thin film source comprises releasing the roll at one end and winding the roll at another end.

6. The method of claim 4, wherein the thin film source is movable in forward, backward, left, and right directions along a plane facing the substrate.

7. The method of claim 1, wherein the thin film comprises material to from an organic light-emitting layer of an organic light-emitting display apparatus.

8. The method of claim 7, wherein the transferring of the thin film to the substrate comprises forming the organic light-emitting layer of the organic light-emitting display apparatus.

* * * * *